(12) United States Patent
Van Bezooijen et al.

(10) Patent No.: US 7,477,106 B2
(45) Date of Patent: Jan. 13, 2009

(54) POWER AMPLIFIER WITH BIAS CONTROL

(75) Inventors: Adrianus Van Bezooijen, Nijmegen (NL); Dmitry Pavlovich Prikhodko, Nijmegen (NL)

(73) Assignee: NXP B.V., Eindhoven (NL)

( * ) Notice: Subject to any disclaimer, the term of this patent is extended or adjusted under 35 U.S.C. 154(b) by 274 days.

(21) Appl. No.: 10/539,383

(22) PCT Filed: Nov. 20, 2003

(86) PCT No.: PCT/IB03/05408

§ 371 (c)(1),
(2), (4) Date: Jun. 15, 2005

(87) PCT Pub. No.: WO2004/057756

PCT Pub. Date: Jul. 8, 2004

(65) Prior Publication Data
US 2006/0145766 A1 Jul. 6, 2006

(30) Foreign Application Priority Data
Dec. 19, 2002 (EP) .................................. 02080377

(51) Int. Cl.
*H03F 3/04* (2006.01)
*H03F 1/22* (2006.01)
*H03G 3/20* (2006.01)
(52) U.S. Cl. .................. 330/296; 330/129; 330/311
(58) Field of Classification Search .................. None
See application file for complete search history.

(56) References Cited

U.S. PATENT DOCUMENTS

| | | | | |
|---|---|---|---|---|
| 6,043,714 A * | 3/2000 | Yamamoto et al. | .......... | 330/296 |
| 6,259,901 B1 | 7/2001 | Shinomiya et al. | | |
| 6,271,695 B1 * | 8/2001 | Gramegna et al. | .......... | 327/110 |
| 6,300,837 B1 * | 10/2001 | Sowlati et al. | .............. | 330/296 |
| 6,359,516 B1 * | 3/2002 | Luo et al. | .................... | 330/296 |
| 6,515,546 B2 * | 2/2003 | Liwinski | ..................... | 330/296 |
| 6,563,385 B2 * | 5/2003 | Wojslaw | ..................... | 330/296 |
| 6,744,321 B2 * | 6/2004 | Noh et al. | ................... | 330/296 |
| 6,791,418 B2 * | 9/2004 | Luo et al. | .................... | 330/296 |
| 6,873,211 B1 * | 3/2005 | Thompson et al. | ......... | 330/285 |
| 7,005,923 B2 * | 2/2006 | Noh et al. | ................... | 330/296 |
| 7,091,788 B2 * | 8/2006 | Glass et al. | ................. | 330/296 |
| 2002/0024390 A1 * | 2/2002 | Yamashita et al. | .......... | 330/298 |
| 2002/0140503 A1 * | 10/2002 | Fujiwara et al. | ............... | 330/51 |
| 2002/0171483 A1 * | 11/2002 | Shinjo et al. | ................ | 330/136 |
| 2002/0172059 A1 * | 11/2002 | Shinomiya et al. | ........... | 363/59 |
| 2003/0087626 A1 * | 5/2003 | Prikhodko et al. | .......... | 455/341 |

* cited by examiner

*Primary Examiner*—Robert Pascal
*Assistant Examiner*—Krista M Flanagan

(57) ABSTRACT

A power amplifier (100) suitable for use in mobile telecommunications equipment has a first stage (2) and an optional second stage (2), each stage being provided with a bias circuit (4, 5). To provide a well-defined gain characteristic, in the first stage (1) a bias current (Ib1) is fed into a signal amplifying transistor (T1). The first bias circuit (4) comprises non-linear a voltage/current converter (41) coupled to a current mirror (40). To suit alternative applications, such as GSM and UMTS requiring a different bias, plural voltage/current converters (41, 42) may be provided in parallel.

9 Claims, 3 Drawing Sheets

POWER AMPLIFIER WITH BIAS CONTROL

Figure 1:
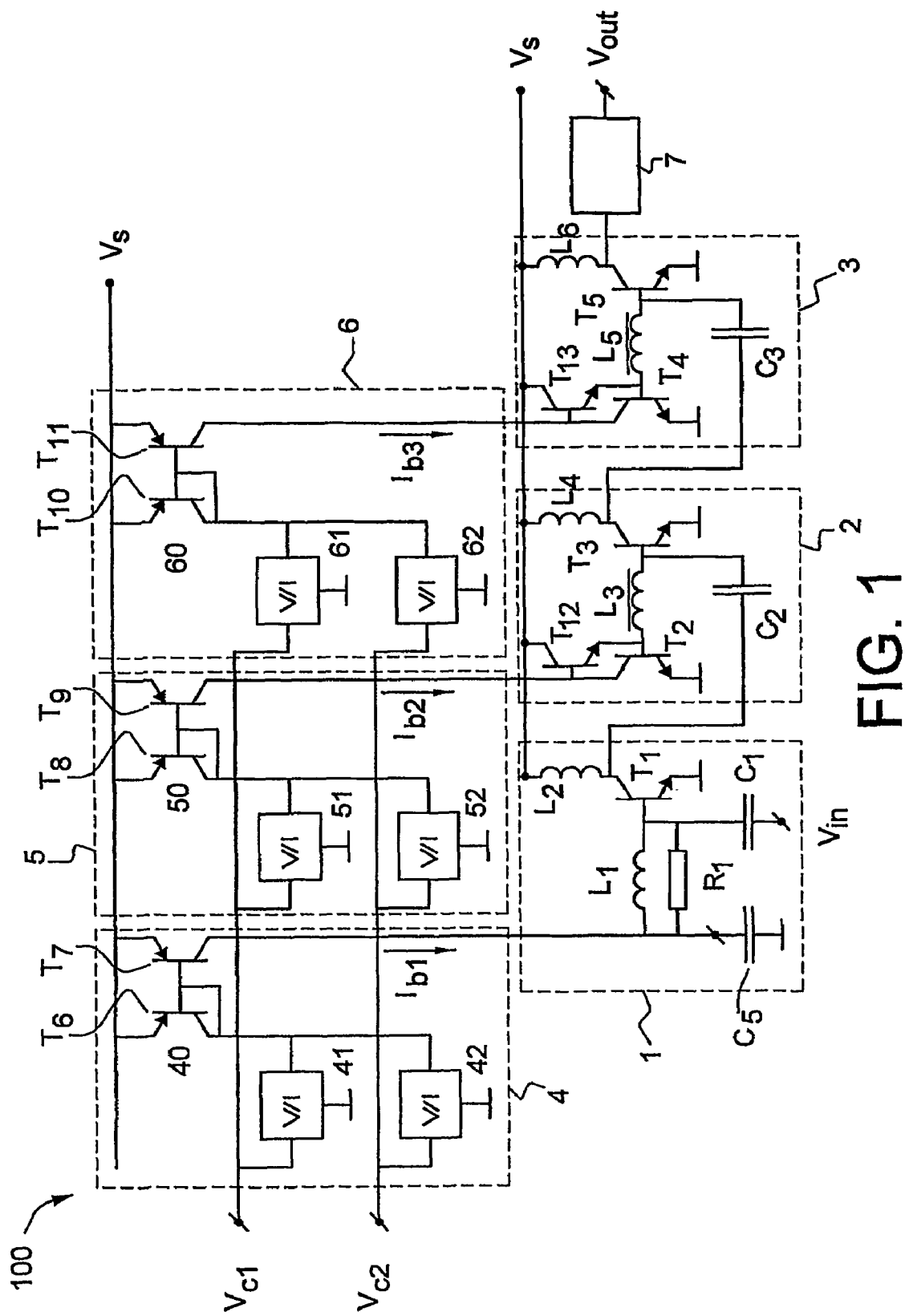

The present invention relates to a power amplifier. More in particular, the present invention relates to a power amplifier which may for example be utilized in high-frequency applications, such as mobile telecommunications equipment.

Power amplifiers are well known. To achieve a suitable amplification of an input signal at the various stages the amplifier may have, a gain control signal typically determines the operating point and thereby the gain of each stage. To achieve a desired overall gain characteristic, the so-called power control curve, a careful tuning of the operating points of the various stages is required.

An multi-stage radio frequency power amplifier is disclosed in U.S. Pat. No. 6,259,901. The first and second stages of this known multi-stage power amplifier are differential amplifiers, each coupled to ground via a bipolar transistor acting as a current source and to which a bias current is fed. The bias currents of the respective stages are supplied by bias circuits which receive a gain control signal and a single reference voltage. Details of the bias current circuits are not disclosed.

This known power amplifier presupposes a balanced input signal, for which a differential amplifier is provided. However, in many applications a balanced input signal is not available or not desirable. In addition, for many applications it is necessary to have a well-defined, substantially straight power control curve. Such a power control curve is not guaranteed by the power amplifier known from the above US patent.

It is an object of the present invention to overcome these and other problems of the Prior Art and to provide a power amplifier for single-sided (unbalanced) input signals which has a well-defined power control curve.

It is another object of the present invention to provide a power amplifier the gain of which is independent of the signal to be amplified.

It is a further object of the present invention to provide a power amplifier which is suitable for radio frequency applications.

Accordingly, the present invention provides a power amplifier comprising:
a first stage for amplifying an input signal, and
a first bias circuit for providing a bias current to the first stage, the first bias circuit comprising a controlled current source, and the first bias circuit being arranged for feeding its bias current to a control electrode of a signal amplification transistor of the first stage.

By feeding the bias current to a signal amplification transistor of the first stage, the operating point of the transistor and hence its gain can be carefully controlled. The control electrode preferably is the base of a bipolar transistor. The first stage preferably only has a single transistor but if it is provided with two or more transistors, the bias current is preferably fed to the first transistor in the signal path but may be fed to the other transistors as well.

In a preferred embodiment, a bias circuit comprises a non-linear voltage/current converter, preferably coupled with a current mirror. That is, the relationship between the gain control signal and the bias current is preferably non-linear. In this way, a very advantageous gain characteristic can be obtained. However, approximately linear voltage/current converters can also be utilized.

The non-linear voltage/current converter preferably comprises at least one differential stage, each stage coupled to a reference voltage. The differential amplifier may consist of only two transistors and a resistor, thus providing a very compact yet efficient circuit. Any non-linear characteristics of the voltage/current converter can be achieved by utilizing the non-linear properties of the transistors. If two differential stages are used within a single converter, each stage is preferably coupled to a distinct respective reference voltage.

In a preferred embodiment of the power amplifier of the present invention, at least one bias circuit comprises at least two distinct voltage/current converters for converting two distinct gain control voltages. This allows a different bias to be provided for different modes of operation, such as, in the case of mobile telephone sets, GSM, Edge and UMTS. Each of the at least two converters may convert the respective gain control voltage into a current, as described above. In a particularly advantageous embodiment of the present invention, however, the first bias circuit further comprises bias voltage means for additionally providing a bias voltage to the first stage. That is, the first bias circuit may produce a bias current in response to a first gain control signal and a bias voltage in response to a second gain control signal. In this way, the power amplifier of the present invention can be easily adapted to various different applications having distinct requirements.

In a further advantageous embodiment, in the first bias circuit an additional transistor is coupled between the at least one voltage/current converter and the controlled current source so as to compensate for the DC current gain of the signal amplification transistor.

To achieve a higher overall gain the power amplifier of the present invention may further comprise a second stage for amplifying a signal output by the first stage and a second bias circuit for providing a bias current to the second stage, and optionally a third stage for amplifying a signal output by the second stage, and an associated third bias circuit for providing a bias current to the third stage.

The power amplifier according to the present invention may be arranged for amplifying high frequency signals, such as signals used for mobile telephony.

The present invention further provides a device provided with a power amplifier as defined above. The device preferably is a mobile telecommunications device, more preferably a GSM telephone set.

The present invention will further be explained below with reference to exemplary embodiments illustrated in the accompanying drawings, in which:

FIG. 1 schematically shows a preferred embodiment of a power amplifier according to the present invention.

Figure 2:
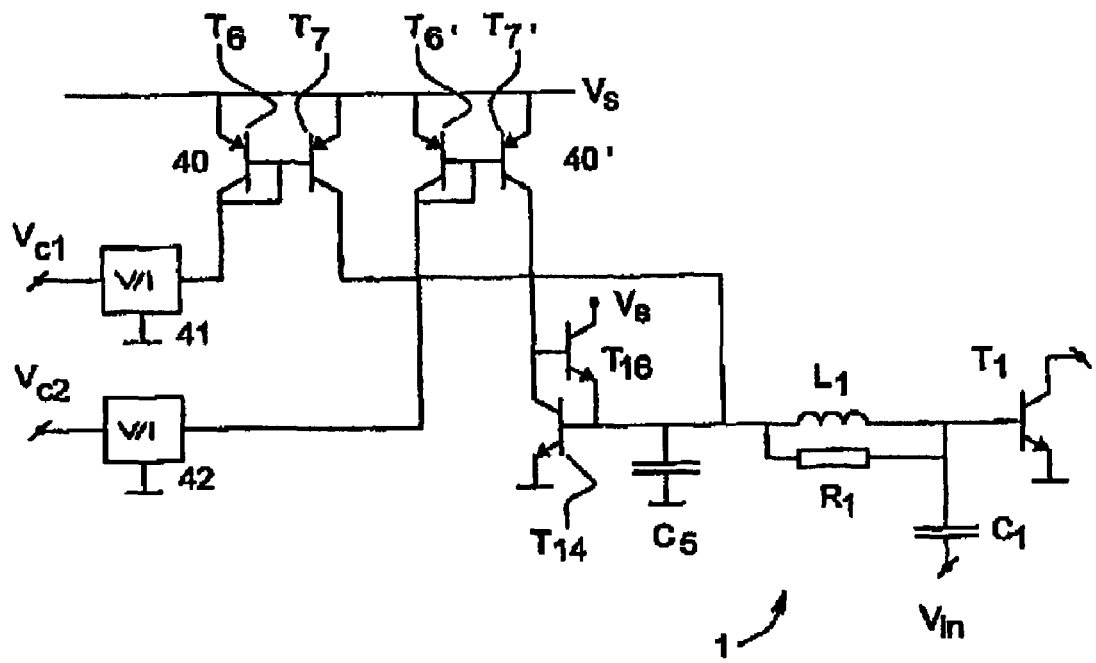

FIG. 2 schematically shows a first alternative embodiment of a first stage of a power amplifier according to the present invention.

Figure 3:
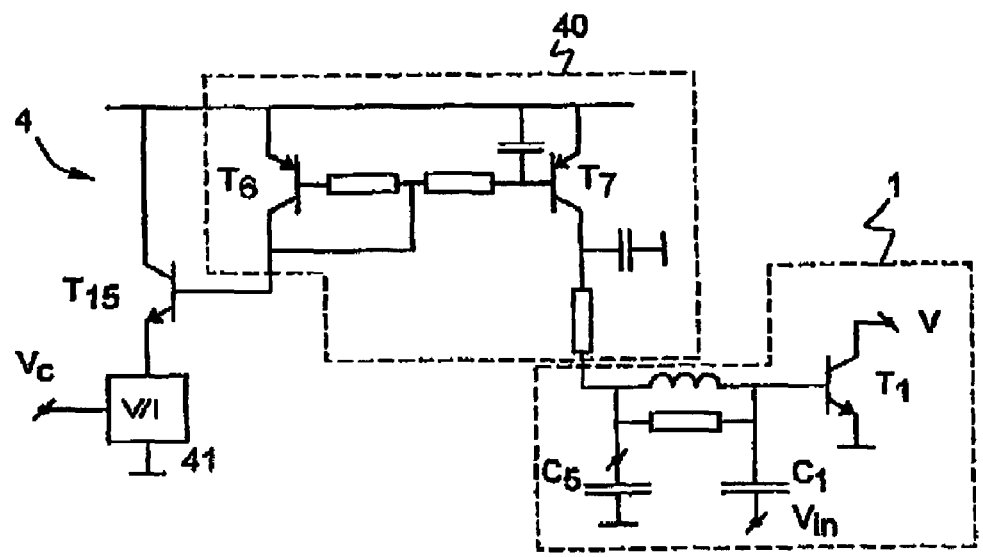

FIG. 3 schematically shows a second alternative embodiment of a first stage of a power amplifier according to the present invention.

Figure 4:
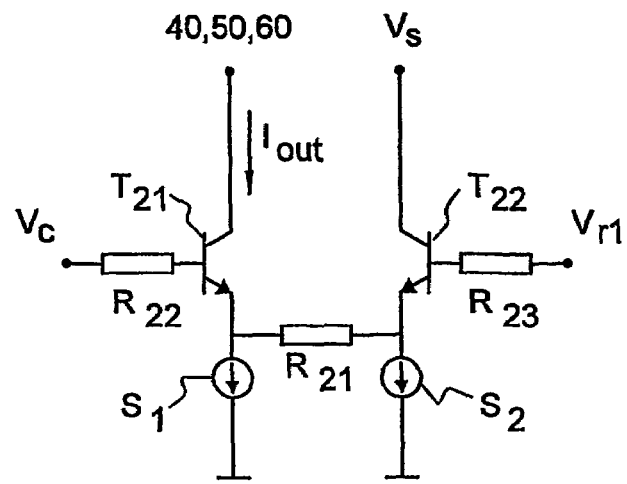

FIG. 4 schematically shows a non-linear voltage/current converter circuit for use in a power amplifier according to the present invention.

Figure 5:
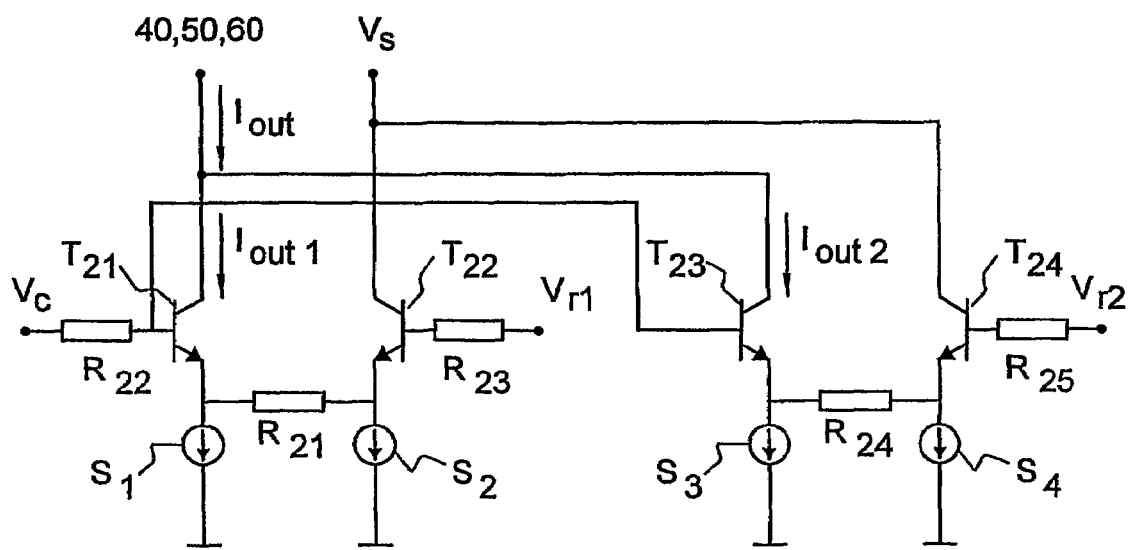

FIG. 5 schematically shows an alternative embodiment of a non-linear voltage/current converter circuit for use in a power amplifier according to the present invention.

Figure 6:
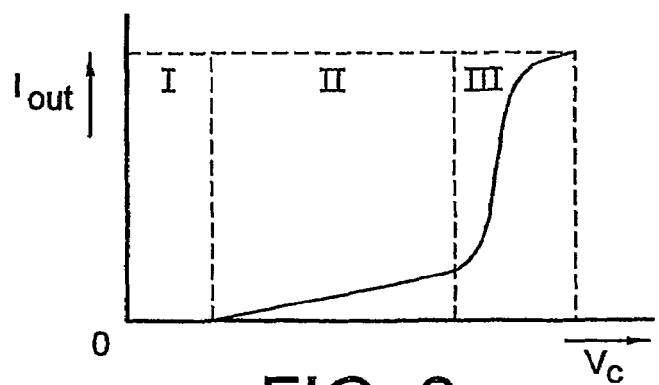

FIG. 6 schematically shows the voltage/current characteristic of the converter circuit of FIG. 5.

The power amplifier 100 shown merely by way of non-limiting example in FIG. 1 comprises a first stage 1, a second stage 2 and a third stage 3. Each stage has an associated bias circuit 4, 5, 6. The embodiment shown is designed for RF (radio frequency) applications and contains various components, in particular inductors, especially for this purpose. The invention is, however, not limited to RF applications and those skilled in the art will appreciate that such dedicated components may be omitted in other applications.

In the embodiment shown, the first stage 1 comprises a first bipolar transistor $T_1$ of the NPN-type. The input signal $V_{in}$, in the present example an RF signal, is fed via a coupling capacitor $C_1$ to the base of transistor $T_1$. The emitter of transistor $T_1$ is connected to ground, while its collector is connected via an inductor $L_2$ to a positive supply voltage $V_s$ and via a further coupling capacitor $C_2$ to the second stage 2. The first stage 1 further comprises a filter circuit consisting of a first inductor $L_1$, a first resistance $R_1$ connected in parallel to $L_1$, and a capacitor $C_5$. As this filter circuit is designed for decoupling RF signals, its components are not essential to the present invention.

A first bias circuit 4 is connected to the base of the first transistor $T_1$ to supply a (first) bias current $I_{b1}$. In the embodiment shown in FIG. 1, the first bias circuit 4 comprises a controlled current mirror 40, constituted by transistors $T_6$ and $T_7$, and two voltage/current converters 41 and 42. These converters 41, 42 may receive a gain control signal $V_{c1}$, $V_{c2}$ respectively. Depending on the particular mode of operation of the power amplifier 100, for example GSM or UMTS, either the first gain control signal $V_{c1}$ or the second gain control signal $V_{c2}$ is present. The converter 41 or 42 converts its respective gain control signal into a current which is fed from transistor $T_6$ of current mirror 40. As a result, a current $I_{b1}$ having a proportional magnitude is fed from transistor $T_7$ to transistor $T_1$. This bias current $I_{b1}$, which typically is a DC current, will not be affected by inductor $L_1$ and will flow effectively directly into the base of transistor $T_1$. As will be clear from the above, the bias current $I_{b1}$ is completely independent from the RF input signal $V_{in}$. As a result, the operating point and gain of the signal amplifying transistor $T_1$ are independent from the input signal.

In Prior Art arrangements a bias voltage is applied to the first signal amplifying transistor of the first stage. The present inventors have found that a bias current instead of a bias voltage offers a much better defined operating point of the first stage of the amplifier.

The bias circuits 4, 5 and 6 of the present invention are particularly suitable for providing a well-defined bias current. The converters 41 and 42 and their counterparts 51, 52 and 61, 62 will be discussed later in more detail with reference to FIG. 4. It is noted that in each bias circuit 4, 5, and 6 a single converter (41 or 42 in the case of bias circuit 4) would in principle suffice. According to further aspect of the present invention, however, multiple converters are provided per bias circuit so as to allow multiple gain control signals to be used independently.

The second stage 5 differs from the first stage 1 in that it comprises a current mirror consisting of the transistors $T_2$ and $T_3$, the bases of which are coupled by an inductor $L_3$. The RF signal amplified by the first stage 1 is fed, via coupling capacitor $C_2$, to the base of the third transistor $T_3$. Like transistor $T_1$, the collector of transistor $T_3$ is connected via an inductor $L_4$ to a positive supply voltage $V_s$ and via a further coupling capacitor $C_3$ to the third stage 3. The collector of transistor $T_2$ is coupled to second bias circuit 5 which is, in the embodiment shown, identical to the first bias circuit 4 and the third bias circuit 6. As in the first bias circuit 4, a first bias transistor $T_8$ and a second bias transistor $T_9$ form a current mirror 50, transistor $T_8$ being connected to converters 51 and 52 which convert gain control voltage signals into suitable currents. In contrast to the first stage, the collector of second bias transistor $T_9$ is not directly connected to signal amplifying transistor $T_3$ but to the collector of transistor $T_2$, which together with $T_3$ but to the collector of transistor $T_2$, which together with transistor $T_3$ constitutes a current mirror. A transistor $T_{12}$, the collector of which is connected to a supply voltage $V_s$, provides a suitable base current for transistors $T_2$ and $T_3$ (base current compensation). As a result, the bias of the signal amplifying transistor $T_3$ in the second stage 2 is a voltage bias rather than a current bias as in the first stage 1. A current bias would be possible in this stage but is avoided in the higher stages to prevent any breakdown caused by the well-known avalanche effect.

The third stage 3 is substantially identical to the second stage 2 and comprises transistors $T_4$ and $T_5$, the bases of which are coupled by an inductor $L_5$, and the collector of transistor $T_4$ being coupled to the third bias circuit 6 and to the base of a base current compensation transistor $T_{13}$. The collector of transistor $T_5$ is connected via an inductor $L_6$ to a positive supply voltage $V_s$. At the collector of transistor $T_5$ the output signal $V_{out}$ of the power amplifier 100 is produced, in the embodiment shown via an impedance matching circuit 7.

Although the power amplifier 100 of FIG. 1 is shown to have a double set of converters (41 & 42; 51 & 52; 61 & 62) so to be able to receive two gain control signals corresponding with two distinct modes of operation, this is by no means necessary and in many embodiments only a single set of converters will be provided, that is, only one converter per bias circuit. It is, on the other hand, also possible to provide three or more converters per bias circuit so as to be able to receive three or more gain control signals, possible corresponding to three or more distinct modes of operation.

In FIG. 1, each bias circuit is shown to have a single current mirror circuit (40; $T_6$ & $T_7$ in bias circuit 4). In the alternative embodiment shown in FIG. 2, however, the first bias circuit 4 comprises two current mirrors 40 and 40'. Current mirror 40, consisting of transistors $T_6$ and $T_7$ and coupled to converter 41 to provide a bias current in response to gain control signal $V_{c1}$, is connected as in the first stage 1 of FIG. 1, supplying a bias current to the base of transistor T1. Additional current mirror 40', consisting of transistor $T_6'$ and $T_7'$ and coupled with converter 42, is arranged to provide a bias voltage, rather than a bias current, as in the second stage 2 and the third stage 3 in FIG. 1. To this end, an additional transistor $T_{14}$ is provided which, together with transistor $T_1$, constitutes a current mirror circuit for DC signals. As in FIG. 1, a transistor $T_{16}$ provides a suitable base current for transistor $T_1$.

The arrangement of FIG. 2 allows current and voltage biasing to be used alternatively. In other words, in response to gain control voltages $V_{c1}$ and $V_{c2}$ a suitable biasing mode can be selected. It will be understood that additional converters can be provided to allow additional gain control signals to be received and to be converted into suitable bias currents or bias voltages. It can also be envisaged that the arrangement of FIG. 2 is used to simultaneously provide a bias current and a bias voltage.

Another alternative embodiment of the first bias circuit 4 is shown is FIG. 3, where a compensation transistor $T_{15}$ is arranged between the converter 41 and the current mirror 40. This compensation transistor $T_{15}$ serves to compensate for any variations in the current gain factor beta of signal amplifying transistor $T_1$. The compensation transistor $T_{15}$ is preferably matched to transistor $T_1$ so that both transistors have virtually identical current gain factors beta. Transistor $T_{15}$ effectively divides the (bias) current in current mirror 40 by beta, while transistor $T_1$ multiplies this current by beta, thus effectively canceling out beta. As a result, the bias current is independent from beta. It will be understood that this arrangement can be applied in the circuits of both FIG. 1 and FIG. 2.

In a further advantageous embodiment (not shown), a single voltage/current converter supplies bias currents to two or more parallel first stages 1, or parallel first signal amplifying transistors $T_1$, $T_1'$ in a single first stage 1.

It will be understood that the features of the above embodiments may be combined as desired. For example, a first stage could have both a beta compensation transistor and a combined voltage and current bias circuit.

A particularly advantageous embodiment of a voltage/current converter is shown in FIG. 4. The converter of FIG. 4, which may constitute any or all of converters 41, 42, 51, 52, 61 and 62 of FIG. 1, essentially consists of a differential stage circuit comprised of transistors $T_{21}$ and $T_{22}$, which in the embodiment shown are bipolar NPN-type transistors, the emitters of which are connected via a resistor $R_{21}$. The base of transistor $T_{21}$ receives a control voltage $V_c$ via a resistor $R_{22}$, while transistor $T_{22}$ receives a reference voltage $V_{r1}$ via a resistor $R_{23}$. The collector of transistor $T_{22}$ is connected to a supply voltage $V_s$, while the collector of transistor $T_{21}$ is connected to one of the current mirrors 40, 50, 60 of FIG. 1. Current sources $S_1$ and $S_2$ are connected to the emitters of $T_{21}$ and $T_{22}$ respectively. In a preferred embodiment the currents of current sources $S_1$ and $S_2$ have substantially equal magnitudes. The output current $I_{out}$ is constituted by the current flowing into the collector of $T_{21}$.

An alternative embodiment of a voltage/current converter according to the present invention is shown in FIG. 5. Part of this converter is identical to the one of FIG. 4 and constitutes a first differential stage circuit with transistors $T_{21}$ and $T_{22}$, resistors $R_{21}$, $R_{22}$ and $R_{23}$, and current sources $S_1$ and $S_2$ connected as before. A second differential stage circuit, consisting of transistors $T_{23}$ and $T_{24}$, resistors $R_{24}$ and $R_{25}$ and current sources $S_3$ and $S_4$ is connected in parallel to the first circuit. Transistors $T_{22}$ and $T_{24}$ receive a reference voltage $V_{r1}$ and $V_{r2}$ via resistors $R_{23}$ and $R_{25}$ respectively, while transistors $T_{21}$ and $T_{23}$ both receive the control voltage $V_c$ via a resistor $R_{22}$. In the preferred embodiment, the reference voltages $V_{r1}$ and $V_{r2}$ are not equal, resulting in different "opening points" per circuit, that is, different values of the control voltage $V_c$ at which the particular circuit will start to conduct. The currents $I_{out1}$ flowing into the collector of transistor $T_{21}$ and $I_{out2}$ flowing into the collector of transistor $T_{23}$ together form output current $I_{out}$.

The circuit of FIG. 5 utilizes the two differential stages to produce a non-linear relationship between the input voltage $V_c$ and the output current $I_{out}$. The inventors have found that this non-linear relationship is particularly suitable for producing a bias current as in the circuits of FIGS. 1-3. In addition, the circuit of FIG. 5 is relatively simple and economical.

The non-linear relationship between the control voltage $V_c$ and the output current $I_{out}$ in the circuit of FIG. 5 is schematically depicted in FIG. 6. Below a certain threshold voltage, the output current $I_{out}$ will be virtually zero, this area is indicated I in FIG. 6. In a second area II, only the first differential stage (transistors $T_{21}$ and $T_{22}$) are conducting and the output current $I_{out}$ ($=I_{out1}$) rises approximately proportionally with the control voltage $V_c$. Then another threshold voltage is reached and in an area III both differential stages are conducting, resulting in a total output current $I_{out}$ ($=I_{out1}+I_{out2}$) which rises more than proportionally with the control voltage $V_c$. It can thus be seen that the converter as a whole exhibits a non-linear behavior which, as the inventors have found, is very suitable for providing bias currents in power amplifiers. The regions I, II and III, as well as the slope of the curve are well defined by the resistors. Due to the balanced structure the output current is temperature and supply voltage independent and virtually insensitive to process spread. In addition, the circuit of FIG. 5 is relatively simple and economical.

In the circuits described above, in particular those depicted in FIGS. 1-3, additional components may be provided in practical embodiments for the purposes of, for example, filtering or setting the operating point of the transistors of the various current mirrors. In the circuit of FIG. 3, for example, two resistors could be provided between the bases of transistors $T_6$ and $T_7$, the junction point of the transistors being connected to the collector of $T_6$. A capacitor could be connected between the base of transistor $T_7$ and the supply for noise suppression purposes. Another capacitor could be connected between the collector of transistor $T_7$ and ground, and a resistor could be connected between the collector of $T_7$ and the first stage 1. It will be understood that such components are not essential to the present invention and can be added or omitted as may be required in a specific embodiment.

The power amplifier of the present invention may suitably partitioned into sections embodied in different technologies. In the embodiment of FIG. 1, for example, the third stage 3 and possibly the second stage 2 can advantageously be implemented in GaAs (gallium arsenide), the remainder of the power amplifier being implemented in Si (silicon), thus exploiting the advantageous high frequency properties of circuits implemented in GaAs.

The present invention is based upon the insight that a well-defined bias current fed to a signal amplifying transistor allows an amplifier stage to have a well-defined gain. The present invention utilizes the further insight that non-linear bias circuits may produce very desirable overall amplification characteristics.

It is noted that any terms used in this document should not be construed so as to limit the scope of the present invention. In particular, the words "comprise(s)" and "comprising" are not meant to exclude any elements not specifically stated. Single (circuit) elements may be substituted with multiple (circuit) elements or with their equivalents.

Although various aspects of the present invention have been explained above with reference to multi-stage power amplifiers, it will be understood that the teachings of the present invention are not so limited. Accordingly, providing a suitable bias current into the base of a signal amplifying transistor in the manners indicated above is also advantageous in, for example, single-stage amplifiers and non-RF amplifiers. Similarly, the "multi-mode" arrangement discussed above which allows multiple distinct bias signals to be supplied to bias circuits in dependence on one or more gain control signals can equally well be applied to single-stage amplifiers. In addition, this "multi-mode" arrangement may also be utilized independently, that is, without the bias current measures discussed above.

It will therefore be understood by those skilled in the art that the present invention is not limited to the embodiments illustrated above and that many modifications and additions may be made without departing from the scope of the invention as defined in the appending claims.

The invention claimed is:
1. A power amplifier comprising:
a first stage including a signal amplification transistor for amplifying an input signal, the signal amplification transistor having a control electrode responsive to a bias current, and
a first bias circuit including a controlled current source for converting a gain control voltage to the bias current, wherein the bias circuit includes a non-linear voltage/current converter for converting the gain control voltage to the bias current.

2. The power amplifier according to claim 1, wherein the non-linear voltage/current converter coupled to a current mirror for providing the bias current to the control electrode.

3. The power amplifier according to claim 2, wherein the non-linear voltage/current converter includes at least one differential stage coupled to a reference voltage.

4. A power amplifier comprising:
a first stage for amplifying an input signal, and
a first bias circuit for providing a bias current to the first stage,
the first bias circuit including a controlled current source, and the first bias circuit being arranged for feeding its bias current to a control electrode of a signal amplification transistor of the first stage, wherein at least one bias circuit comprises two distinct voltage/current converters for converting two distinct gain control voltages.

5. The power amplifier according to claim 1, wherein the first bias circuit further includes bias voltage means for providing a bias voltage to the first stage.

6. A power amplifier comprising:
a first stage for amplifying an input signal, and
a first bias circuit for providing a bias current to the first stage,
the first bias circuit including a controlled current source and a voltage/current converter, and the first bias circuit being arranged for feeding its bias current to a control electrode of a signal amplification transistor of the first stage, wherein in the first bias circuit an additional transistor is coupled between the voltage/current converter and the controlled current source so as to compensate for a DC current gain of the signal amplification transistor.

7. The power amplifier according claim 1, further comprising:
a second stage for amplifying a signal output by the first stage;
a second bias circuit for providing a second stage bias current to the second stage;
a third stage for amplifying a signal output by the second stage; and
third bias circuit for providing a third stage bias current to the third stage.

8. The power amplifier according to claim 1, wherein the power amplifier is arranged for amplifying high frequency signals.

9. A device provided with a power amplifier according to claim 1.

* * * * *